(12) United States Patent
Satoh et al.

(10) Patent No.: US 9,450,168 B2
(45) Date of Patent: Sep. 20, 2016

(54) MULTILAYER PIEZOELECTRIC DEVICE

(71) Applicant: TDK CORPORATION, Tokyo (JP)

(72) Inventors: Yasuyuki Satoh, Tokyo (JP); Keisuke Itakura, Tokyo (JP); Jun Sugawara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/720,062

(22) Filed: May 22, 2015

(65) Prior Publication Data

US 2015/0340589 A1    Nov. 26, 2015

(30) Foreign Application Priority Data

May 26, 2014 (JP) .................................. 2014-107973

(51) Int. Cl.
*H01L 41/083* (2006.01)
*H01L 41/047* (2006.01)

(52) U.S. Cl.
CPC ....... *H01L 41/0836* (2013.01); *H01L 41/0471* (2013.01)

(58) Field of Classification Search
CPC ............ H01L 41/0471; H01L 41/083; H01L 41/0831; H01L 41/0833
USPC ...................... 310/328, 363–366; 347/68–72
See application file for complete search history.

(56) References Cited

U.S. PATENT DOCUMENTS

| | | | |
|---|---|---|---|
| RE35,011 E * | 8/1995 | Wersing | B06B 1/0648 310/322 |
| 6,211,606 B1 * | 4/2001 | Kanda | B41J 2/14274 310/328 |
| 6,409,320 B1 * | 6/2002 | Kurihara | B41J 2/14274 347/68 |
| 7,196,458 B2 | 3/2007 | Hiyoshi | |
| 8,534,805 B2 * | 9/2013 | Sano | B41J 2/14274 347/68 |
| 2003/0020364 A1 * | 1/2003 | Nakatani | H01L 41/29 310/311 |
| 2005/0001514 A1 * | 1/2005 | Takeuchi | B41J 2/14209 310/328 |
| 2005/0017601 A1 * | 1/2005 | Hiyoshi | B41J 2/04541 310/328 |
| 2007/0257968 A1 * | 11/2007 | Hashimoto | B41J 2/14274 347/72 |
| 2014/0267507 A1 * | 9/2014 | Yoshida | H01L 41/293 347/68 |
| 2015/0325777 A1 * | 11/2015 | Irie | B41J 2/14274 347/50 |

FOREIGN PATENT DOCUMENTS

JP    2003-250281 A    9/2003

* cited by examiner

*Primary Examiner* — J. San Martin
(74) *Attorney, Agent, or Firm* — Oliff PLC

(57) ABSTRACT

A multilayer piezoelectric device comprises a multilayer body and first and second outer electrodes. The multilayer body has base, first and second driving parts, and non-driving part. The driving parts and non-driving part extend from the base along stacking direction. The first driving part is closer to the non-driving part than the second driving part. Each driving part has first and second inner electrodes opposing each other in stacking direction. The base has a third inner electrode extending along a plane orthogonal to the stacking direction. The first outer electrode is connected to the first inner electrode. The second outer electrode is connected to the second and third inner electrodes. In the stacking direction, the overlap area of the third and second inner electrode of the first driving part is greater than the overlap area of the third and second inner electrode of the second driving part.

6 Claims, 11 Drawing Sheets

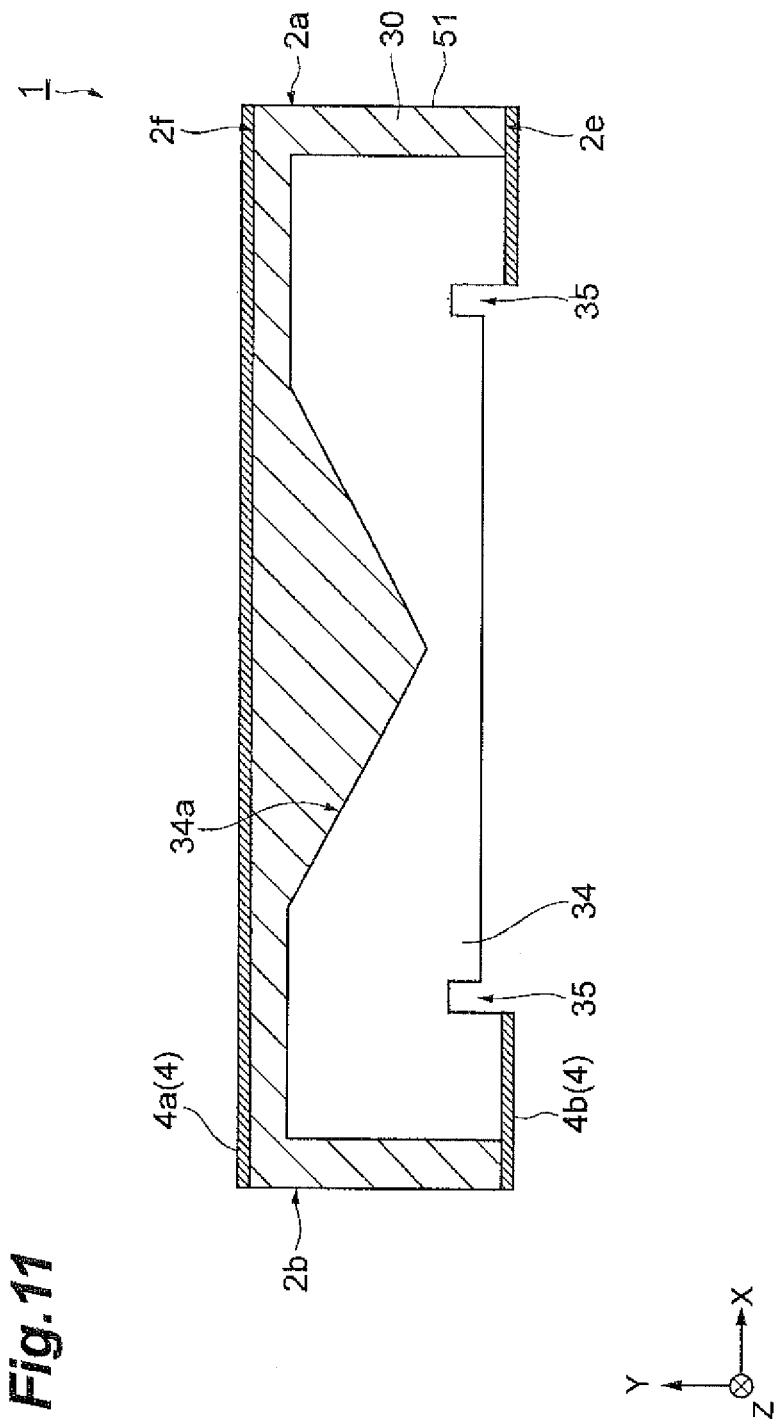

MULTILAYER PIEZOELECTRIC DEVICE

BACKGROUND

1. Field

The present disclosure relates to a multilayer piezoelectric device.

2. Disclosure of the Related Art

Japanese Patent Application Laid-Open No. 2003-250281 discloses a multilayer piezoelectric device used for an ink ejecting head provided in an ink-jet printer, for example. The multilayer piezoelectric device has a multilayer body in which piezoelectric layers are stacked, a common outer electrode, and a plurality of discrete outer electrodes. The multilayer body has a base and a plurality of driving parts and a pair of non-driving parts which extend from a principal surface of the base along the stacking direction of the piezoelectric layers. The multilayer body has first and second side faces opposing each other in a direction orthogonal to the stacking direction. The first side face forms one side face of the base, plurality of driving parts, and pair of non-driving parts, while the second side face forms the other side face of the base, plurality of driving parts, and pair of non-driving parts.

The plurality of driving parts and pair of non-driving parts align along a direction orthogonal to both of the stacking direction and the opposing direction of the first and second side faces, such that the plurality of driving parts is disposed between the pair of non-driving parts. In the plurality of driving parts, first and second inner electrodes alternately align along the stacking direction with the piezoelectric layer interposed therebetween. In the pair of non-driving parts, the piezoelectric layers and third inner electrodes alternately align along the stacking direction.

The first inner electrode has one end exposed to the first side face and the other end not exposed to the second side face. The second inner electrode has one end not exposed to the first side face and the other end exposed to the second side face. The third inner electrode has one end and the other end exposed to the first and second side faces, respectively.

The common outer electrode is arranged on the first side face of the multilayer body and connected to one end of the first inner electrode and one end of the third inner electrode. The discrete outer electrodes are arranged on the other side face of the plurality of driving parts and pair of non-driving parts and the other end of the second inner electrode and the other end of the third inner electrode. Therefore, the first and third inner electrodes have the same polarity. The polarity of the first and third inner electrodes differs from that of the second inner electrode.

SUMMARY

In the multilayer piezoelectric device described in Japanese Patent Application Laid-Open No. 2003-250281, a current flows through the first inner electrode, the common outer electrode, the third inner electrode, and the discrete outer electrode of the non-driving part in this order. Therefore, a first conducting path extending from the first inner electrode of the driving part located on the center side of the device in the direction in which the plurality of driving parts and a pair of non-driving parts align with each other to the discrete outer electrode of the non-driving part is longer than a second conducting path extending from the first inner electrode of the driving part located closer to the non-driving part to the discrete outer electrode of the non-driving part in the aligning direction as the former driving part is separated more from the non-driving part than is the latter driving part. Consequently, the first conducting path has a resistance value greater than that of the second conducting path. This causes the driving parts to vary time constants among their equivalent circuits and thus incur differences in their response, whereby variations may occur in displacement when the driving parts are driven.

Therefore, the present disclosure explains a multilayer piezoelectric device which can suppress variations in displacement of driving parts.

The multilayer piezoelectric device in accordance with one aspect of the disclosure comprises a multilayer body formed from a plurality of piezoelectric layers stacked along a first direction, and first and second outer electrodes arranged on a surface of the multilayer body while being electrically insulated from each other. The multilayer body has a base, a non-driving part and first and second driving parts. The non-driving part and first and second driving parts extend in the same first direction from the base. The first and second driving parts and non-driving part align along a second direction orthogonal to the first direction such that the first driving part is closer to the non-driving part than is the second driving part. Each of the first and second driving parts has first and second inner electrodes opposing each other in the first direction through the piezoelectric layer interposed therebetween. The base has a third inner electrode extending along a plane orthogonal to the first direction. The first inner electrode is electrically connected to the first outer electrode but electrically insulated from the second outer electrode. The second and third inner electrodes are electrically connected to the second outer electrode but electrically insulated from the first outer electrode. The second inner electrodes of the first and second driving parts are each adjacent to the third inner electrode in the first direction and partly overlap the third inner electrode as seen in the first direction. A first area where the third inner electrode and the second inner electrode of the first driving part overlap each other is greater than a second area where the third inner electrode and the second inner electrode of the second driving part overlap each other as seen in the first direction.

In the multilayer piezoelectric device in accordance with this aspect of the disclosure, the second driving parts of the first and second driving parts are adjacent to the third inner electrode of the base in the first direction and partly overlap the third inner electrode as seen in the first direction. The second and third inner electrodes are both electrically connected to the second outer electrode and thus have the same polarity. As a consequence, a stray capacitance (also known as parasitic capacitance) occurs between the second and third inner electrodes. In addition, when seen in the first direction, the first area where the third inner electrode and the second inner electrode of the first driving part overlap each other is greater than the second area where the third inner electrode and the second inner electrode of the second driving part overlap each other. Consequently, the stray capacitance occurring between the second inner electrode of the first driving part located closer to the non-driving part and the third inner electrode is greater than the stray capacitance occurring between the second inner electrode of the second driving part located farther from the non-driving part and third inner electrode. Therefore, when the resistance value occurring between the second driving part located farther from the non-driving part is greater than the resistance value occurring between the first driving part located closer to the non-driving part and the outer electrode, the respective equivalent circuits of the driving parts have the same time constant that is based on the stray capacitance multiplied by the resistance value. As a result of the foregoing, the driving parts can have the same response, thereby suppressing variations in displacement of the driving parts.

The multilayer body may have two non-driving parts; the first and second driving parts may align along the second direction so as to be between the two non-driving parts; and, when a middle position is a point separated from the two non-driving parts by the same distance on a virtual line extending in the second direction, the first driving part may be closer to the non-driving part than is the second driving part, while the second driving part is closer to the middle position than is the first driving part.

The multilayer piezoelectric device in accordance with another aspect of the present disclosure comprises a multilayer body formed from a plurality of piezoelectric layers stacked along a first direction, and first and second outer electrodes arranged on a surface of the multilayer body while being electrically insulated from each other. The multilayer body has a base, a non-driving part and first to third driving parts. The non-driving part and first to third driving parts extend in the same first direction from the base. The first to third driving parts and non-driving part align along a second direction orthogonal to the first direction such that the first to third driving parts sequentially increase distance to the non-driving part. Each of the first to third driving parts has first and second inner electrodes opposing each other in the first direction through the piezoelectric layer interposed therebetween. The base has a third inner electrode extending along a plane orthogonal to the first direction. The first inner electrode is electrically connected to the first outer electrode but electrically insulated from the second outer electrode. The second and third inner electrodes are electrically connected to the second outer electrode but electrically insulated from the first outer electrode. The second inner electrodes of the first to third driving parts are each adjacent to the third inner electrode in the first direction and partly overlap the third inner electrode as seen in the first direction. First to third areas where the third inner electrode overlaps the respective second inner electrodes of the first to third driving parts as seen in the first direction decrease sequentially.

In the multilayer piezoelectric device in accordance with this aspect of the disclosure, the second driving parts respectively of the first to third driving parts are adjacent to the third inner electrode of the base in the first direction and partly overlap the third inner electrode as seen in the first direction. The second and third inner electrodes are both electrically connected to the second outer electrode and thus have the same polarity. As a consequence, a stray capacitance occurs between the second and third inner electrodes. In addition, when seen in the first direction, the first to third areas where the third inner electrode overlaps the second inner electrodes of the first to third driving parts decrease sequentially. Consequently, the stray capacitance occurring between the second inner electrode of each driving part and the third inner electrode is greater in the first driving part located closer to the non-driving part and smaller in the third driving part located farther from the non-driving part. Therefore, when the resistance value occurring between the first driving part located closer to the non-driving part and the outer electrode is greater while the resistance value occurring between the third driving part located farther from the non-driving part and the outer electrode is smaller, the respective equivalent circuits of the driving parts have the same time constant that is based on the stray capacitance multiplied by the resistance value. As a result of the foregoing, the driving parts can have the same response, thereby suppressing variations in displacement of the driving parts.

As seen in the first direction, in a third direction orthogonal to both of the first and second directions, the third inner electrode may have a width increasing toward the non-driving part.

The multilayer body may have two non-driving parts; and, when a middle position is a point separated from the two non-driving parts by the same distance on a virtual line extending in the second direction, the first to third driving parts may align along the second direction sequentially from one of the two non-driving parts toward the middle position.

As seen in the first direction, in the third direction orthogonal to both of the first and second directions, the third inner electrode may have a width increasing from the middle position toward the first non-driving part side.

The multilayer piezoelectric device in accordance with this disclosure can suppress variations in displacement of the driving parts.

BRIEF DESCRIPTION OF THE DRAWINGS

FIG. 11 illustrates a cross section of a multilayer piezoelectric device in accordance with yet another example taken along the line VI-VI of FIG. 3A.

DETAILED DESCRIPTION

Figure 1:
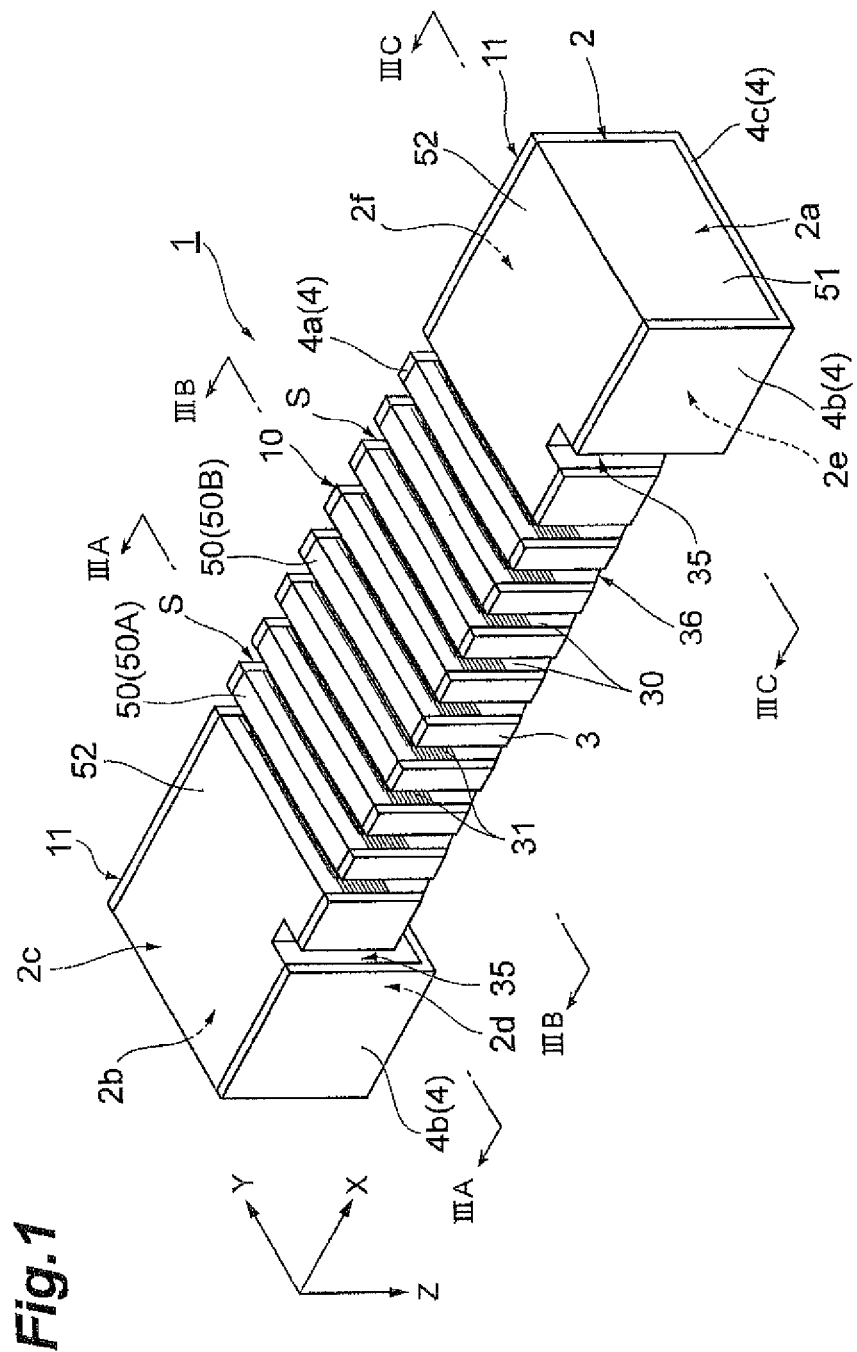
FIG. 1 is a perspective view of a multilayer piezoelectric device as seen from thereabove.

Embodiments in accordance with the disclosure, which will be explained with reference to the drawings, are just examples for explaining the present invention and do not intend to limit the invention to the following details. In the explanation, the same constituents or those having the same functions will be referred to with the same signs while omitting their overlapping descriptions.

A multilayer piezoelectric device 1 comprises a multilayer body 2 and outer electrodes 3, 4. The multilayer piezoelectric device 1 may have a length (a size in the X direction of FIGS. 1 and 2) set on the order of 36.95 mm to 37.05 mm, for example, The multilayer piezoelectric device 1 may have a width (a size in the Y direction of FIGS. 1 and 2) set on the order of 1.85 mm to 1.95 mm, for example. The multilayer piezoelectric device 1 may have a thickness (a size in the Z direction of FIGS. 1 and 2) set on the order of 0.95 mm to 1.05 mm, for example.

The multilayer body 2 is formed by stacking a plurality of piezoelectric layers 30. The multilayer body 2 has a pair of end faces 2a, 2b, a pair of principal surfaces 2c, 2d, and a pair of side faces 2e, 2f. The end faces 2a, 2b oppose each other in the longitudinal direction of the multilayer body 2. The opposing direction of the end faces 2a, 2b, which is the longitudinal direction of the multilayer body 2, is the X direction of FIGS. 1 and 2. The end faces 2a, 2b extend substantially parallel to each other and are substantially orthogonal to the X direction.

The principal surfaces 2c, 2d oppose each other in the thickness direction of the multilayer body 2. The opposing direction of the principal surfaces 2c, 2d, which is the thickness direction of the multilayer body 2, is the Z direction of FIGS. 1 and 2. The principal surfaces 2c, 2d extend substantially parallel to each other and are substantially orthogonal to the Z direction. The principal surfaces 2c, 2d connect the end faces 2a, 2b.

The side faces 2e, 2f oppose each other in the width direction of the multilayer body 2. The opposing direction of the side faces 2e, 2f, which is the width direction of the multilayer body 2, is the Y direction of FIGS. 1 and 2. The side faces 2e, 2f extend substantially parallel to each other and are substantially orthogonal to the Y direction. The side faces 2e, 2f connect the end faces 2a, 2b and the principal surfaces 2c, 2d.

The multilayer body 2 has eight first parts 10 and two second parts 11. The first and second parts 10, 11 align along the X direction. The first parts 10 are between the second parts 11 in the X direction. That is, the second parts 11 are on both end sides in the X direction. The first and second parts 10, 11 are separated from each other. At least one each of the first and second parts 10, 11 may be provided without being restricted to the numbers mentioned above.

Figure 2:
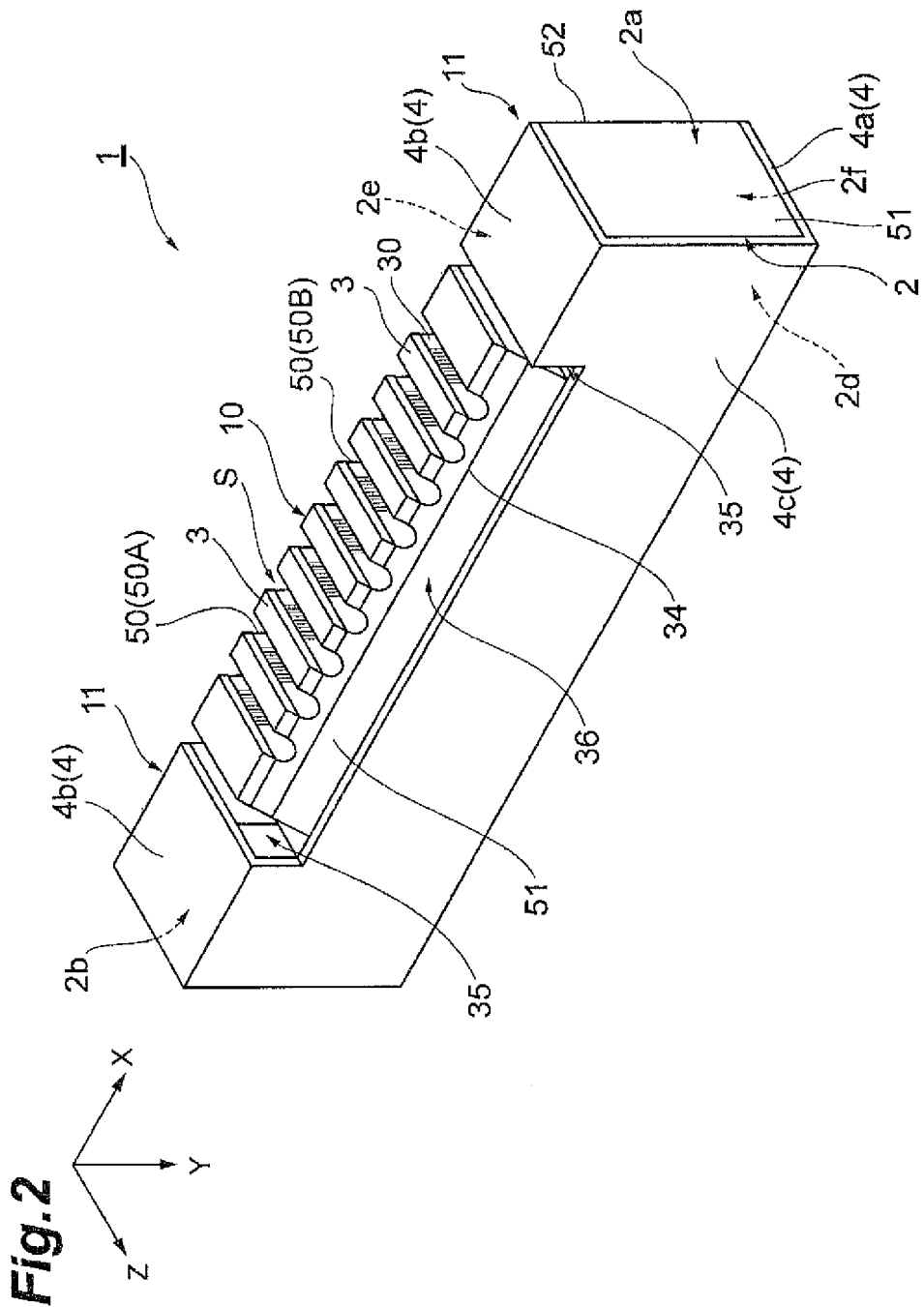
FIG. 2 is a perspective view of a multilayer piezoelectric device as seen from thereunder.

As illustrated in FIGS.1 and 2, each first part 10 is constituted by a driving part 50 and a part of a base 51. In each first part 10, the driving part 50 extends in the same direction from the base 51 along the Z direction. The driving part 50 and the base 51 are formed integrally with each other. The driving part 50 includes a piezoelectrically active part (active region).

The driving part 50 is rectangular when seen in each of the Y and Z directions. One of the side faces of the driving part 50 opposing each other in the Y direction forms a part of the side face 2e. The other of the side faces of the driving part 50 opposing each other in the Y direction forms a part of the side face 2f. One of the side faces of the driving part 50 opposing each other in the Z direction connects a pair of side faces of the driving part 50 and forms a part of the principal surface 2c.

The driving part 50 has a length in the Y direction longer than that in the X direction. Slits S are formed at substantially equal intervals between the driving parts 50 adjacent to each other. As a consequence, there are nine slits S in this embodiment. The slits S open to the principal surface 2c side and extend in the Z direction.

Figure 3A:
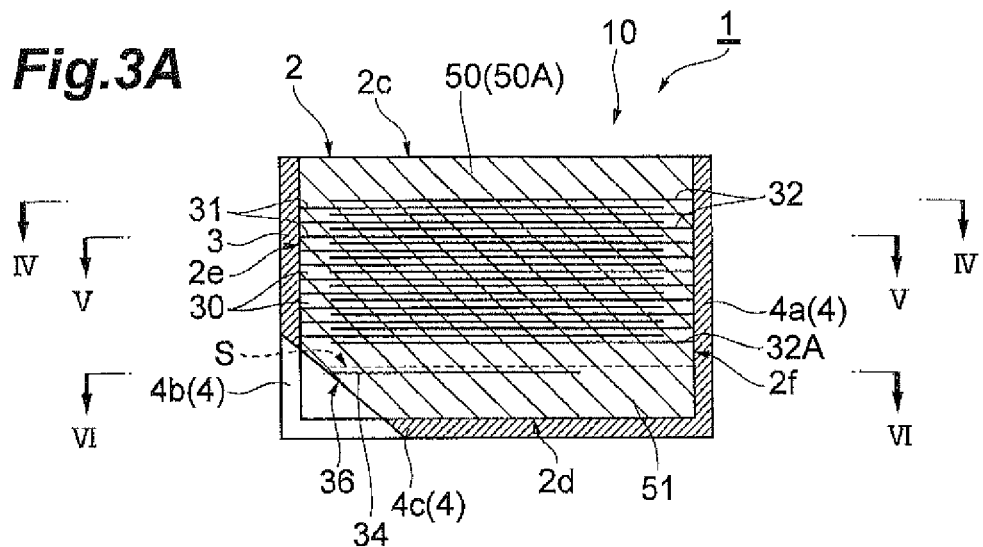
FIG. 3A illustrates a cross section taken along the line IIIA-IIIA of FIG. 1.
Figure 7:
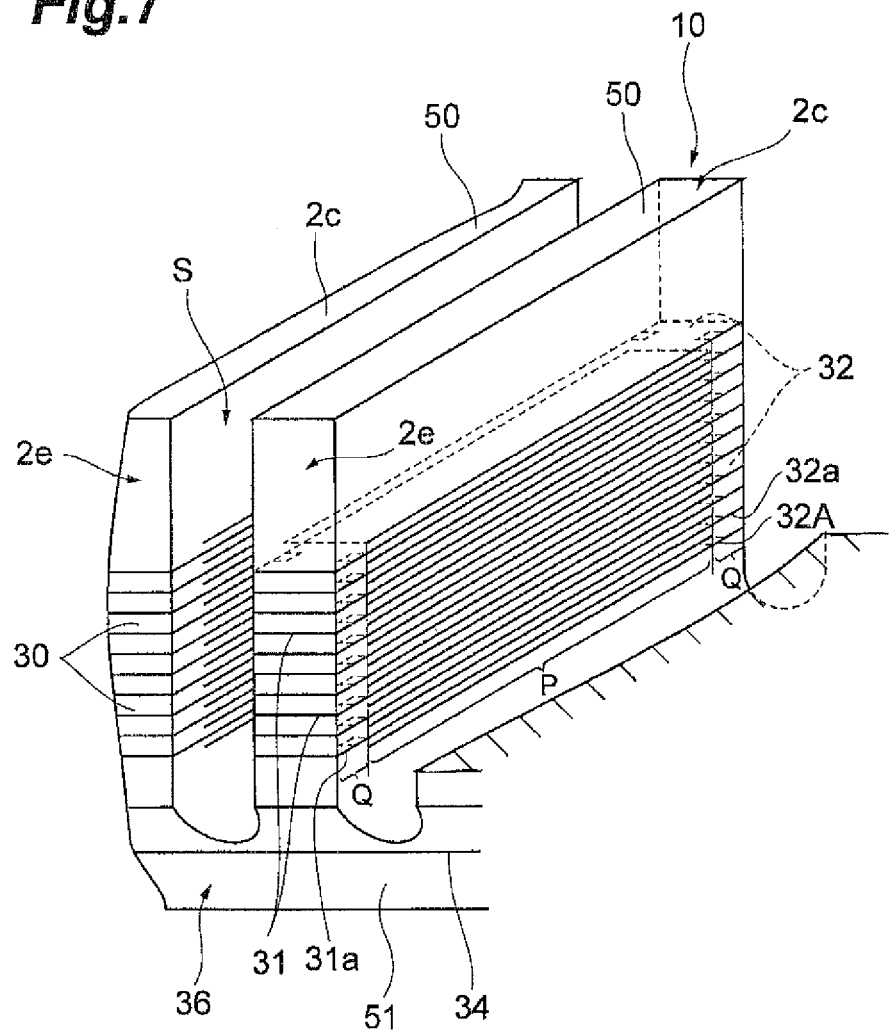
FIG. 7 is a perspective view illustrating a driving part under magnification.

As illustrated in detail in FIGS. 3A and 7, the driving part 50 includes a plurality of piezoelectric layers 30 and a plurality of rectangular inner electrodes 31, 32. The piezoelectric layers 30 and inner electrodes 31, 32 are stacked in the Z direction. The stacking direction of the piezoelectric layers 30 and inner electrodes 31, 32 (hereinafter referred to as stacking direction) is the opposing direction of the principal surfaces 2c, 2d, the thickness direction of the multilayer body 2, and the Z direction of FIGS. 1 and 2.

The piezoelectric layer 30 is made of a piezoelectric ceramic material mainly containing lead zirconate titanate (PZT: $Pb(Zr_x, Ti_{1-x})O_3$), for example. The piezoelectric layers 30 are integrated to such an extent that they are visually indiscernible in the actual multilayer piezoelectric device 1. In this embodiment, each piezoelectric layer 30 may have a thickness set on the order of 10 µm to 50 µm.

Figure 3B:
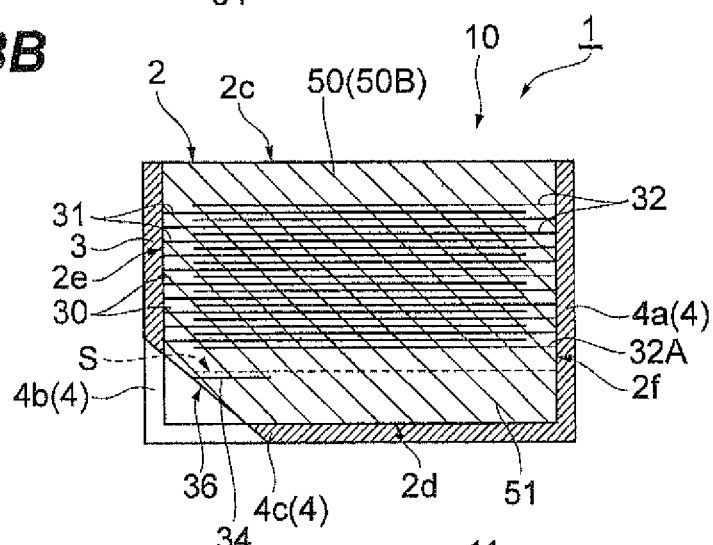
FIG. 3B illustrates a cross section taken along the line IIIB-IIIB of FIG. 1.
Figure 5:
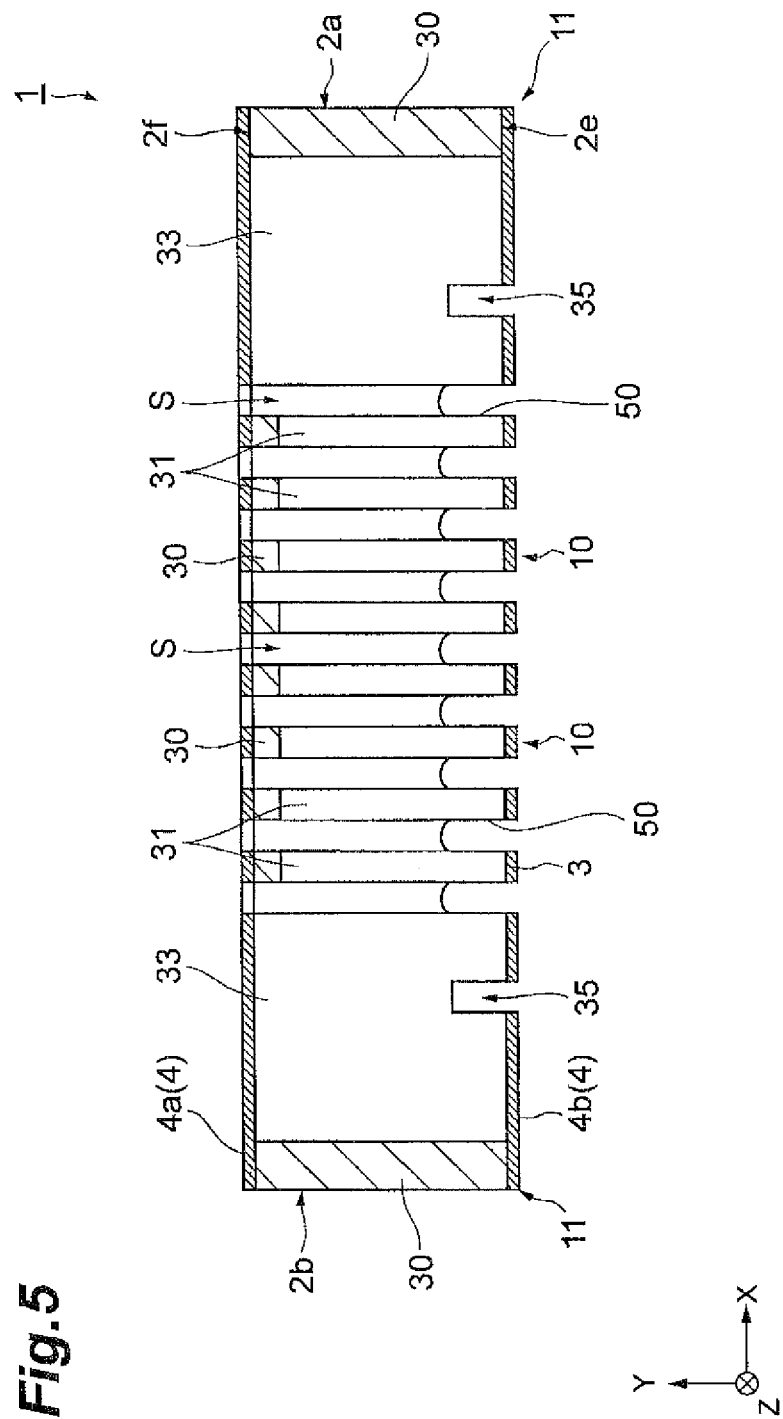
FIG. 5 is a cross-sectional view taken along the line V-V of FIG. 3A.

The plurality of inner electrodes 31 align along the stacking direction so as to oppose each other in the stacking direction. The inner electrodes 31 extend substantially parallel to each other and are substantially orthogonal to the Z direction. The number of inner electrodes 31, which is not restricted in particular, is 10 in FIGS. 3A, 3B, and 7. As illustrated in FIGS. 3A, 3B, and 5, one end of each inner electrode 31 extends to the side face 2e so as to be exposed there. The other end of the inner electrode 31 extends to the vicinity of the side face 2f but is separated from the side face 2f in the opposing direction of the side faces 2e, 2f. Therefore, the other end of the inner electrode 31 is not exposed to the side face 2f.

Figure 4:
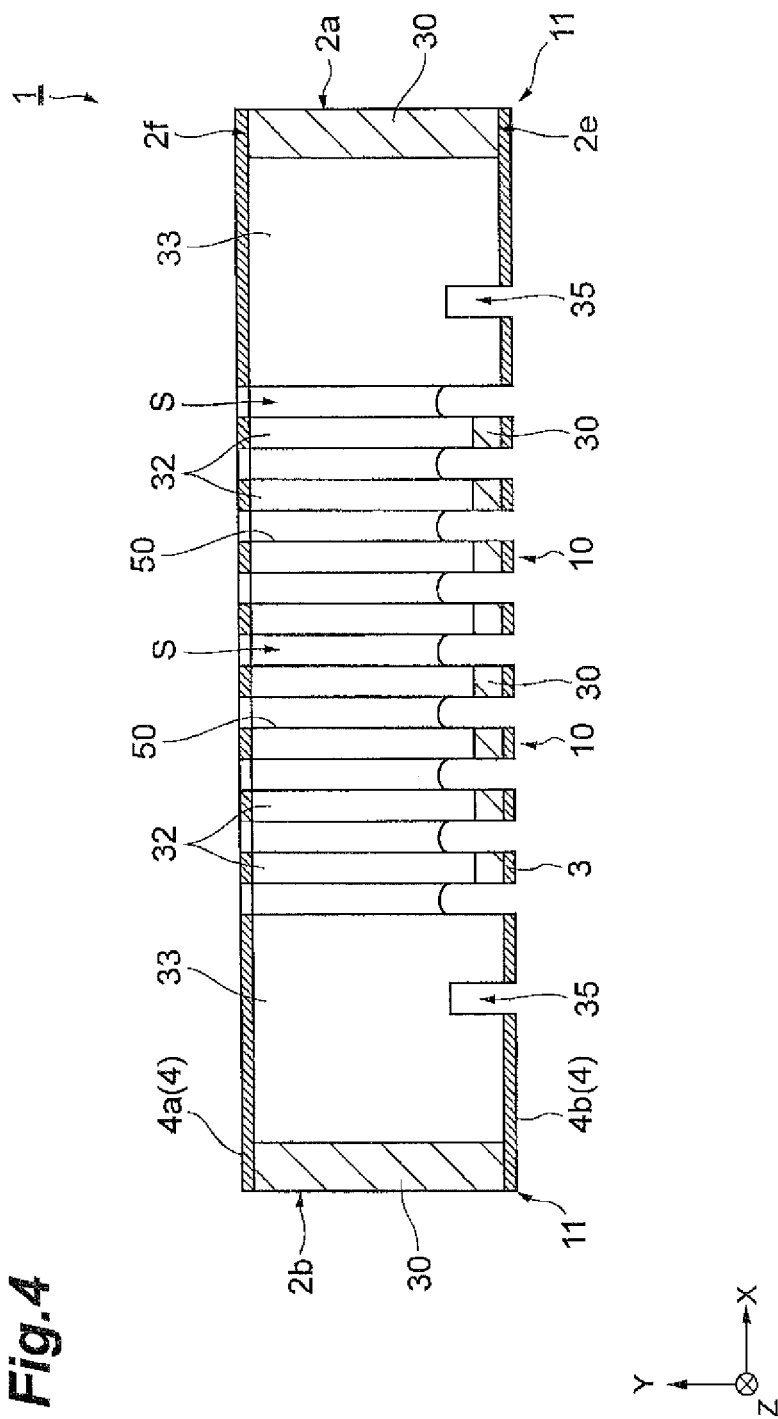
FIG. 4 is a cross-sectional view taken along the line IV-IV of FIG. 3A.

The plurality of inner electrodes 32 align along the stacking direction so as to oppose each other in the stacking direction. The inner electrodes 32 extend substantially parallel to each other and are substantially orthogonal to the Z direction. The number of inner electrodes 32, which is not restricted in particular, is 11 in FIGS. 3A, 3B, and 7. As illustrated in FIGS. 3A, 3B, and 4, one end of each inner electrode 32 extends to the side face 2f and is exposed there. The other end of the inner electrode 32 extends to the vicinity of the side face 2e but is separated from the side face 2e in the opposing direction of the side faces 2e, 2f. Therefore, the other end of the inner electrode 32 is not exposed to the side face 2e. In this embodiment, the electrode located closest to the base 51 in the inner electrodes 31, 32 is the inner electrode 32. In the following, the inner electrode 32 located closest to the base 51 in each driving part 50 will be referred to as an inner electrode 32A.

The inner electrodes 31, 32 may be constituted by conductive materials mainly containing silver (Ag) and palladium (Pd). Each of the inner electrodes 31, 32 may have a thickness set on the order of 0.5 µm to 3 µm, for example. Cu (copper) may be used as a conductive material. The interval between the inner electrodes 31, 32 adjacent to each other in the stacking direction may be set, for example, on the order of 10 µm to 50 µm, i.e., on the same level as the thickness of the piezoelectric layer 30 located between the inner electrodes 31, 32 adjacent to each other, or on the order of 20 µm.

Except for the inner electrode 32A, the inner electrodes 31, 32 alternately align in the stacking direction. As illustrated in FIG. 7, the inner electrodes 31, 32 have an overlapping part P in the stacking direction and a non-overlapping part Q in the stacking direction. The part P is a part corresponding to the active part in the driving part 50. The part Q is a part corresponding to the inactive part in the driving part 50.

As illustrated in FIGS.1 and 2, each of the second part 11 is constituted by a non-driving part 52 and a part of the base 51. In each second part 11, the non-driving part 52 extends in the same direction from the base 51 along the Z direction. The non-driving part 52 extends from the base 51 in the same direction as with the driving part 50. The non-driving part 52 and the base 51 are formed integrally with each other. The non-driving part 52 includes a piezoelectrically inactive part (inactive region).

One of the side faces opposing each other in the Y direction in the non-driving part 52 fauns a part of the side face 2e. The other of the side faces opposing each other in the Y direction in the non-driving part 52 forms a part of the side face 2f. One of the side faces opposing each other in the Z direction in the non-driving part 52 connects a pair of side faces of the non-driving part 52 and forms a part of the principal surface 2c. A groove 35 extending in the Z direction is formed on the side face 2e side of the non-driving part 52.

Figure 3C:
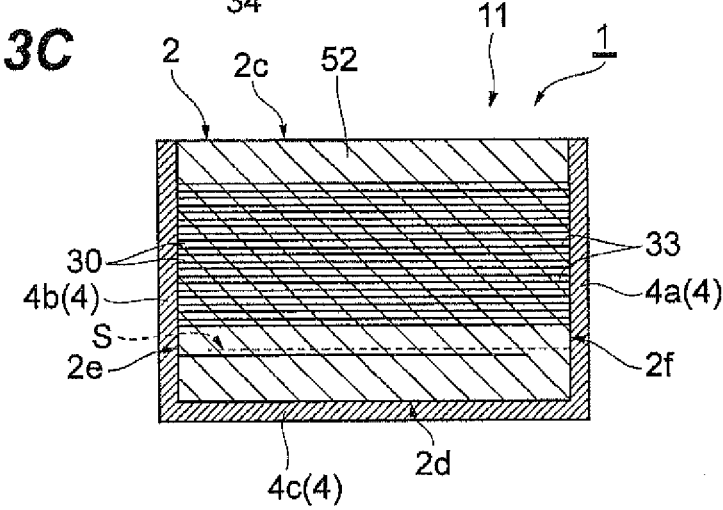
FIG. 3C illustrates a cross section taken along the line IIIC-IIIC of FIG. 1.

As illustrated in detail in FIG. 3C, the non-driving part 52 includes a plurality of piezoelectric layers 30 and a plurality of rectangular inner electrodes 33. The piezoelectric layers 30 and inner electrodes 33 are stacked in the Z direction. The stacking direction of the piezoelectric layers 30 and inner electrodes 33 is substantially the same as that of the piezoelectric layers 30 and inner electrodes 31, 32.

The plurality of inner electrodes 33 align along the stacking direction so as to oppose each other in the stacking direction. The inner electrodes 33 are adjacent to each other and oppose each other through the piezoelectric layer 30. The inner electrodes 33 extend substantially parallel to each other and are substantially orthogonal to the Z direction. The number of inner electrodes 33, which is not restricted in particular, is 21 in FIG. 3C. One end of each inner electrode 33 extends to the side face 2f and is exposed there. The other end of the inner electrode 33 extends to the side face 2e and is exposed there.

The inner electrodes 33 may be constituted by conductive materials mainly containing silver (Ag) and palladium (Pd). Each of the inner electrodes 33 may have a thickness set on the order of 0.5 µm to 3 µm, for example, Cu (copper) may be used as a conductive material. The distance in a straight line between the inner electrodes 33 adjacent to each other in the stacking direction may be set, for example, on the order of 10 µm to 50 µm, i.e., on the same level as the thickness of the piezoelectric layer 30 located between the inner electrodes 33 adjacent to each other, or on the order of 20 µm.

The base 51 has a rectangular parallelepiped form. One of the side faces opposing each other in the X direction in the base 51 forms a part of the end face 2a. The other of the side faces opposing each other in the X direction in the base 51 forms a part of the end face 2b. One of the side faces opposing each other in the Y direction in the base 51 forms a part of the end face 2e. The other of the side faces opposing each other in the Y direction in the base 51 forms a part of the end face 2f. One of the side faces opposing each other in the Z direction in the base 51 connects a pair of side faces of the base 51 and forms a part of the principal surface 2d.

As illustrated in FIGS. 2, 3A, 3B, and 7, the base 51 includes a plurality of piezoelectric layers 30 and an inner electrode 34. The piezoelectric layers 30 and inner electrode 34 are stacked in the Z direction. The stacking direction of the piezoelectric layers 30 and inner electrode 34 is substantially the same as that of the piezoelectric layers 30 and inner electrodes 31, 32.

This embodiment employs only one inner electrode 34. As illustrated in detail in FIG. 6, the inner electrode 34 extends along a plane orthogonal to the stacking direction within the base 51. The inner electrode 34 overlaps the driving parts 50 and non-driving parts 52 as seen in the stacking direction.

Figure 6:
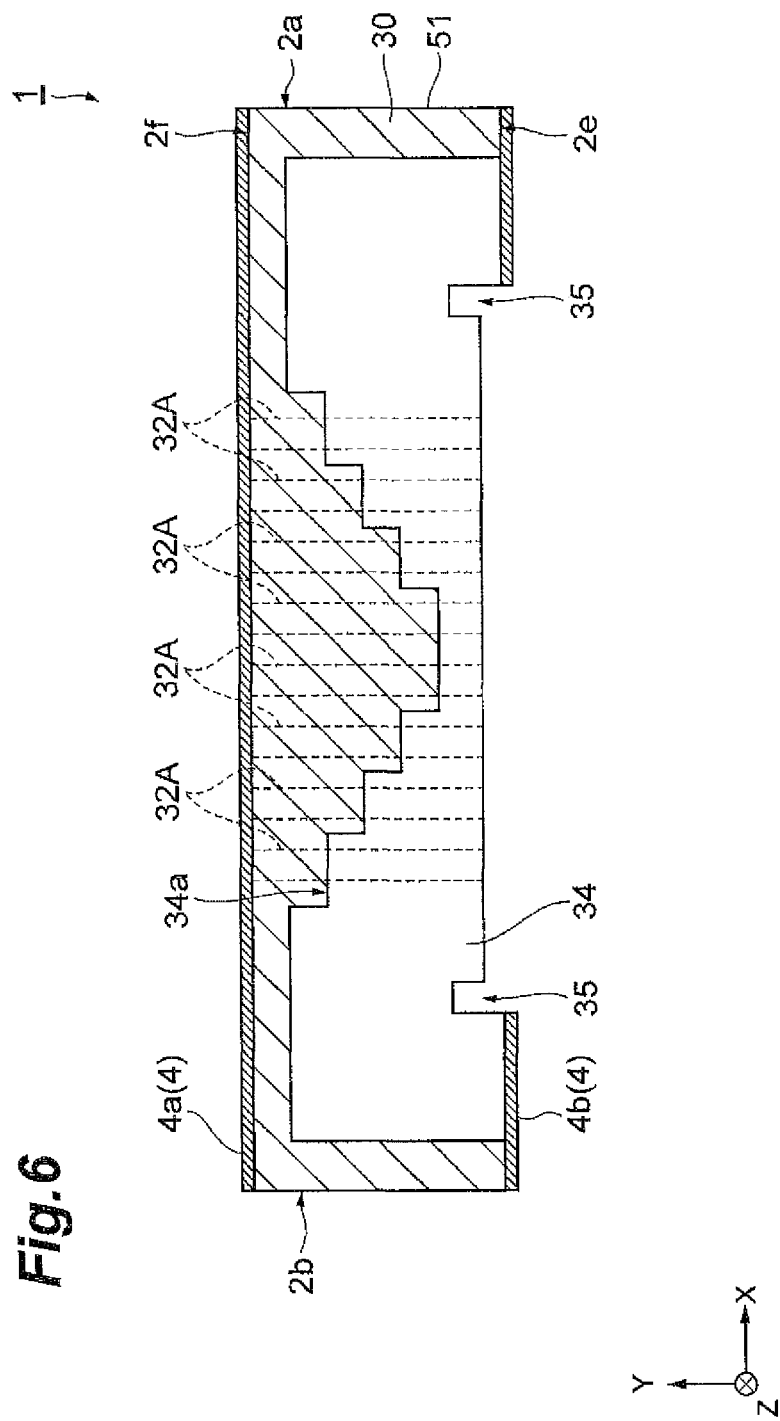
FIG. 6 is a cross-sectional view taken along the line VI-VI of FIG. 3A.

As illustrated in FIG. 6, both ends of the inner electrode 34 closer to the end faces 2a, 2b are not exposed to the end faces 2a, 2b, respectively. The end of the inner electrode 34 closer to the side face 2e is exposed to a part forming a side face of the non-driving part 52 in the side faces 2e, 2f. The end of the inner electrode 34 closer to the side face 2f is not exposed to the side face 2f.

Letting a middle position be a point separated from the two non-driving parts 52 by the same distance on a virtual line extending in the Z direction, the width in the Y direction of the inner electrode 34 increases from the middle position toward the non-driving parts 52 (from the center in the X direction of the multilayer body 2 toward the end faces 2a, 2b). Therefore, when seen in the stacking direction, a part 34a which is a side edge, closer to the side face 2f in the inner electrode 34, located between the two non-driving parts 52 in the X direction approaches the side face 2f as it advances from the middle position toward the non-driving parts 52 in the X direction. As illustrated in FIG. 6, the part 34a is formed like steps in this embodiment. In the following, one driving part 50 located closer to the end face 2a, 2b will be referred to as driving part 50A, while one driving part 50 located closer to the center in the X direction of the multilayer body 2 will be referred to as driving part 50B (see FIGS. 1, 2, 3A, 3B, and 3C).

The inner electrode 34 is adjacent to the inner electrode 32A in the stacking direction. When seen in the stacking direction, the inner electrodes 34, 32A overlap partly. Since the part 34a of the inner electrode 34 is shaped as mentioned above, the area where the inner electrodes 34, 32A overlap when seen in the stacking direction increases from the middle position toward the non-driving parts 52 in the X direction. That is, when seen in the stacking direction, the area where the inner electrode 34 overlaps the inner electrode 32A of the driving part 50A is greater than the area where the inner electrode 34 overlaps the inner electrode 32A of the driving part 50B.

As illustrated in FIGS., 1 to 5, the outer electrodes 3 are arranged on the side face 2e in the respective driving parts 50. The outer electrodes 3 are connected physically and electrically to the ends of the inner electrodes 31 exposed to the side face 2e. The outer electrodes 3 are independent from each other physically and electrically. Each outer electrode 3 may be constituted by a metal film containing three layers of Cr, Cu/Ni, and Au, for example. The thickness of the outer electrode 3 may be set on the order of 0.3 µm to 5.0 µm, for example. Ag, Ag—Pd, Ag—Sn, and the like may be used in place of the metal film of Au, for example.

The outer electrode 4 is electrically insulated from the outer electrodes 3. As illustrated in FIGS. 1 and 2, the outer electrode 4 has a region 4a arranged all over the side face 2f, regions 4b arranged on the side face 2e in the respective non-driving parts 52, and a region 4c arranged all over the principal surface 2d. The structure of the outer electrode 4 is the same as that of the outer electrodes 3.

The region 4a is connected physically and electrically to the end of the inner electrode 32 exposed to the side face 2f. The region 4a has a form corresponding to forms of the driving parts 50 and exhibits depressions and projections at positions corresponding to the driving parts 50. The regions 4b are connected physically and electrically to the ends of the inner electrodes 33, 34 exposed to the side face 2e. The region 4c connects the regions 4a, 4b physically and electrically.

A cutout 36 cutting the multilayer body 2 is formed at a corner part between the side face 2e and principal surface 2d, which is a part located between two grooves 35 in the multilayer body 2. The cutout 36 is a tilted surface which tilts with respect to the side face 2e and principal surface 2d.

In the multilayer piezoelectric device 1 constructed as in the foregoing, the inner electrodes 31 and outer electrodes 3 are electrically connected to each other and have the same polarity. The inner electrode 32 to 34 and outer electrode 4 are electrically connected to each other and have the same polarity. The inner electrodes 31 and outer electrodes 3 are not electrically connected to the inner electrodes 32 to 34 and outer electrode 4.

When a voltage is applied between the outer electrodes 3, 4, a voltage is also applied between the inner electrodes 31, 32. This causes an electric field in the piezoelectric layers 30 located in the active part in the driving parts 50, thereby the driving parts 50 are displaced. In the non-driving parts 52, on the other hand, the piezoelectric layers 30 are between the inner electrodes 33, whereby no electric field occurs in the piezoelectric layers 30. Therefore, the non-driving parts 52 are not displaced.

Figure 8:
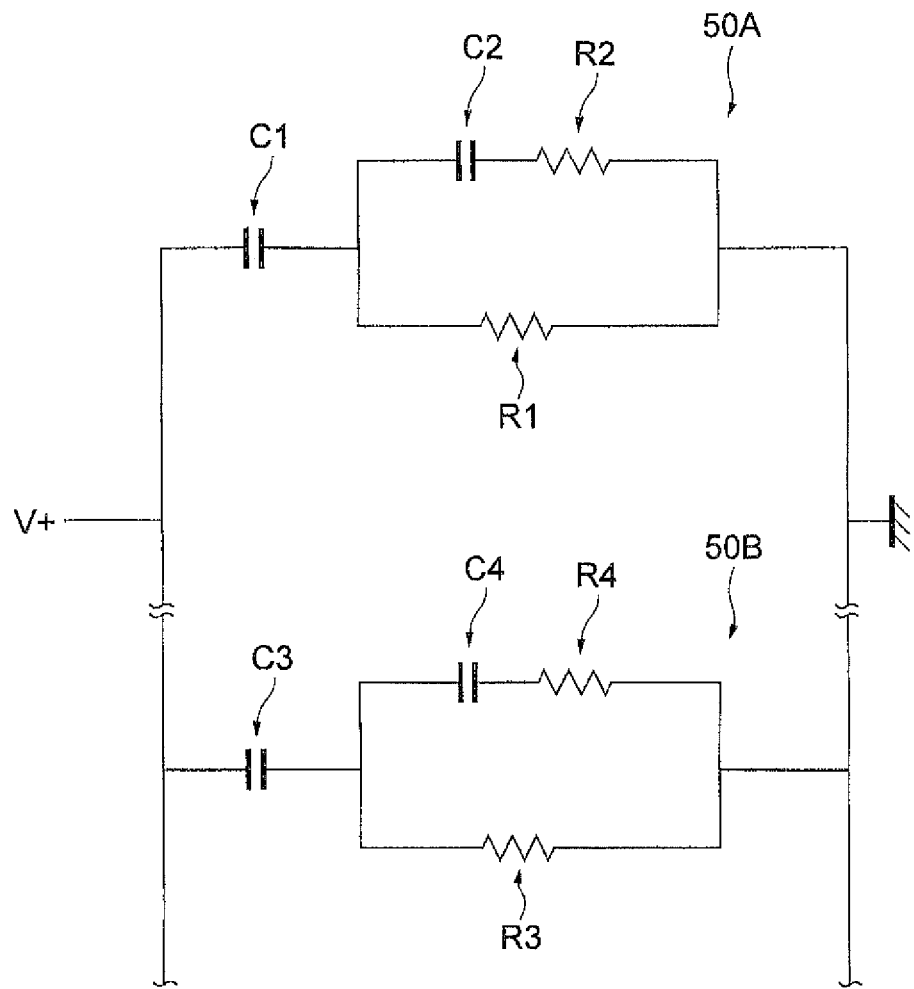
FIG. 8 is a diagram illustrating an equivalent circuit of the multilayer piezoelectric device.

Equivalent circuits of the multilayer piezoelectric device 1 will now be explained with reference to FIG. 8. FIG. 8 illustrates two driving parts 50A, 50B in the eight driving parts 50 and omits the other driving parts 50. The driving part 50A has capacity components C1, C2 and resistance components R1, R2. The driving part 50B has capacity components C3, C4 and resistance components R3, R4. An equivalent circuit constituting the driving part 50A and an equivalent circuit constituting the driving part 50B are connected in parallel.

The capacity component C1 represents a capacity component constituted by the inner electrodes 31, 32 of the driving part 50A. The capacity component C2 represents a capacity component resulting from a stray capacitance occurring between the inner electrode 32A of the driving part 50A and the inner electrode 34 of the base 51. The resistance component R1 represents a resistance component of a conducting path in which a current flows through the inner electrode 32 of the driving part 50A, the region 4a of the outer electrode 4, the region 4c of the electrode 4 (or inner electrode 33), and the region 4b of the outer electrode 4 in sequence. The resistance component R2 represents a resistance component of a conducting path in which a current flows through the inner electrode 34 and the region 4b of the outer electrode 4 in sequence.

The capacity component C1 is connected in series with the capacity component C2 and resistance components R1, R2. The resistance component R1 is connected in parallel with the capacity component C2 and resistance component R2. The capacity component C2 and resistance component R2 are connected in series with each other. Expression 1 represents the time constant τA of the equivalent circuit of the driving part 50A at this case.

$$\tau A = (C1^{-1} + C2^{-1})^{-1} \times (R1^{-1} + R2^{-1})^{-1} \quad (1)$$

The capacity component C3 represents a capacity component constituted by the inner electrodes 31, 32 of the driving part 50B. When the driving parts 50A, 50B have the same structure, the magnitude of the capacity component C3 is the same as that of the capacity component C1. The capacity component C4 represents a capacity component resulting from a stray capacitance occurring between the inner electrode 32A of the driving part 50B and the inner electrode 34 of the base 51. The resistance component R3 represents a resistance component of a conducting path in which a current flows through the inner electrode 32 of the driving part 50B, the region 4a of the outer electrode 4, the region 4c of the outer electrode 4 (or inner electrode 33), and the region 4b of the outer electrode 4 in sequence. The resistance component R4 represents a resistance component of a conducting path in which a current flows through the inner electrode 34 and the region 4b of the outer electrode 4 in sequence.

The capacity component C3 is connected in series with the capacity component C4 and resistance components R3, R4. The resistance component R3 is connected in parallel with the capacity component C4 and resistance component R4. The capacity component C4 and resistance component R4 are connected in series with each other. Expression 2 represents the time constant τB of the equivalent circuit of the driving part 50B at this case.

$$\tau B = (C3^{-1} + C4^{-1})^{-1} \times (R3^{-1} + R4^{-1})^{-1} \quad (2)$$

An example of methods of manufacturing the multilayer piezoelectric device 1 will now be explained. First, a piezoelectric ceramic material mainly containing lead zirconate titanate is mixed with an organic binder, an organic solvent, and the like, so as to produce a base paste, and green sheets to become the piezoelectric layers 30 are formed by doctor blading from the base paste. On the other hand, a metal material containing silver and palladium at predetermined ratios is mixed with an organic binder, an organic solvent, and the like, so as to produce a conductive paste for forming electrode patterns.

Next, electrode patterns corresponding to the inner electrodes 31 to 34 are formed by screen printing on the green sheets. Then, the green sheets formed with the electrode patterns corresponding to the inner electrodes 31, 33, the green sheets formed with the electrode patterns corresponding to the inner electrodes 32, 33, the green sheet formed with the electrode pattern corresponding to the inner electrode 34, and the green sheets to become the piezoelectric layers 30 are stacked, so as to produce a green multilayer body.

Subsequently, the green multilayer body is pressed at a predetermined pressure in the stacking direction while heating it at a predetermined temperature (e.g., about 60° C.) and then is cut into a predetermined size. Thereafter, the green multilayer body is degreased at a predetermined temperature (e.g., about 400° C.) and then is fired for a predetermined time at a predetermined temperature (e.g., about 1100° C.), so as to yield the multilayer body 2.

Next, three layers of a metal film are formed in the order of Cr, Cu/Ni, and Au by sputtering on the surfaces corresponding to the side faces 2e, 2f and principal surface 2d of the multilayer body 2, so as to form an outer electrode. The grooves 35 are formed along the stacking direction in the surface corresponding to the side face 2e in the multilayer body 2, so as to divide the outer electrode. The cutout 36 is formed at a corner part between the side face 2e and principal surface 2d of the multilayer body 2.

Subsequently, the slits S are formed by a dicing blade, for example. The foregoing produces the multilayer piezoelectric device 1.

In the foregoing embodiment, when seen in the stacking direction, the area where the inner electrode 34 and the inner electrode 32A of the driving part 50A overlap each other is greater than the area where the inner electrode 34 and the inner electrode 32A of the driving part 50B overlap each other. Therefore, the capacity component C2 is greater than the capacity component C4. On the other hand, the driving part 50A is closer to the non-driving part 52 than is the driving part 50B, whereby the resistance component R1 is smaller than the resistance component R3. The expression 1 representing the time constant τA includes the product of the resistance component R1 and capacity component C2, while the expression 2 representing the time constant τB includes the product of the resistance component R3 and capacity component C4. Therefore, the time constants τA and τB are equal to each other. The foregoing enables the driving parts 50 to have the same response, thereby making it possible to suppress variations in displacement of the driving parts 50.

Figure 9:
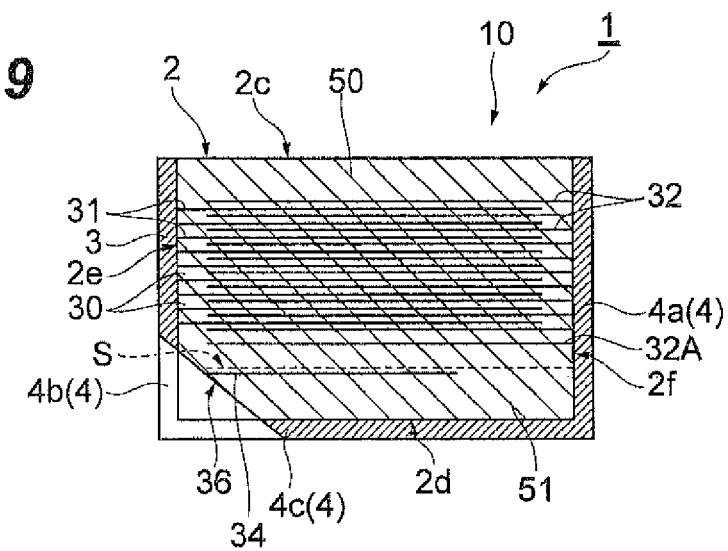
FIG. 9 illustrates a cross section of a multilayer piezoelectric device in accordance with another example taken along the line IIIA-IIIA of FIG. 1.

While an embodiment of the present invention is explained in the foregoing, various modifications may be added to the above-mentioned embodiment within the scope of the gist of the present invention. For example, since it is sufficient for the electrode located closest to the base 51 among the inner electrodes in the driving parts 50 to have the same polarity as that of the inner electrode 34 in the base 51, a plurality of inner electrodes 32 may align in the stacking direction at a part near to the base 51 in the driving parts 50 as illustrated in FIG. 9.

Figure 10:
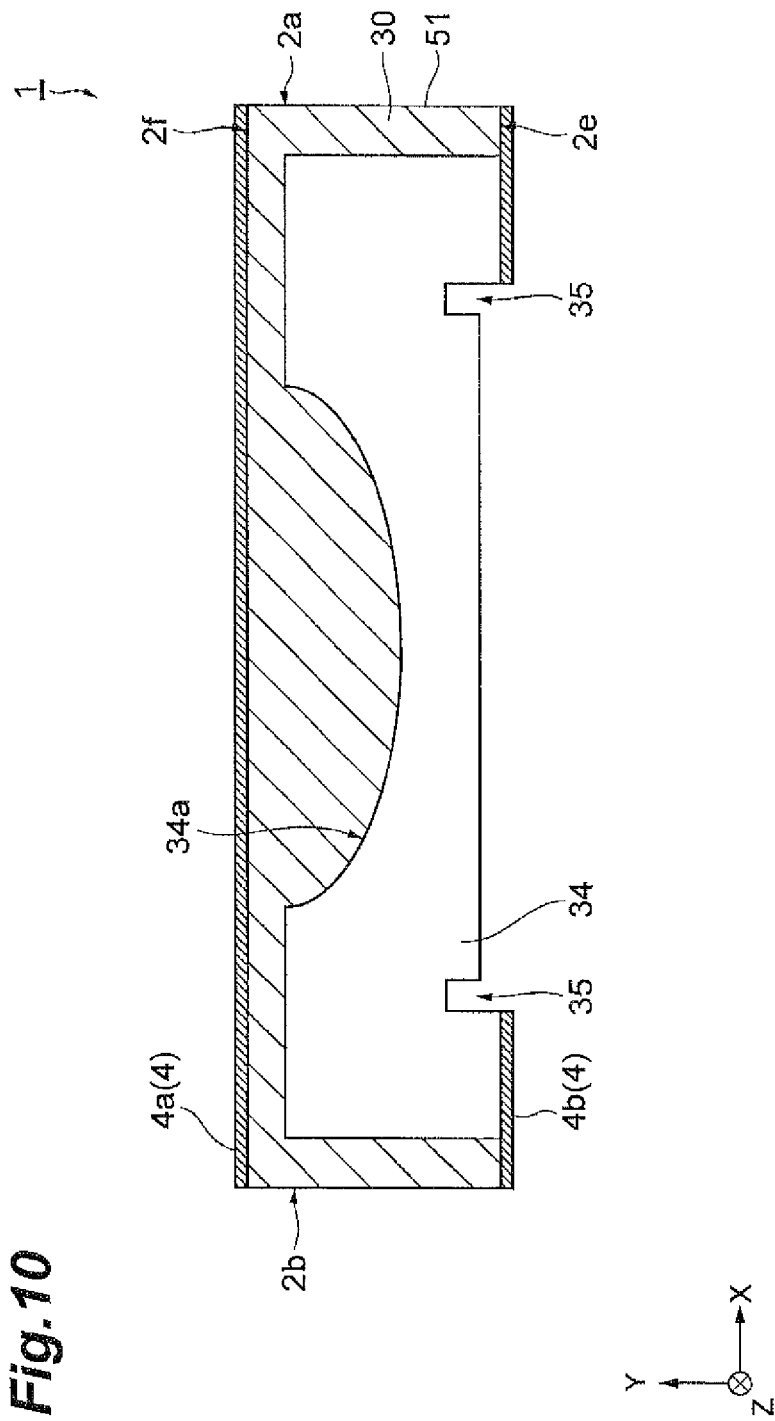
FIG. 10 illustrates a cross section of a multilayer piezoelectric device in accordance with still another example taken along the line VI-VI of FIG. 3A.

It is sufficient for the width in the Y direction of the part 34a to become greater from the middle position toward the non-driving parts 52 in the X direction (from the center of the multilayer body 2 in the X direction toward the end faces 2a, 2b). Therefore, the form of the part 34a is not limited in particular. For example, the form of the part 34a may be curved (arced) as illustrated in FIG. 10, triangular as illustrated in FIG. 11, or combinations of lines and curves which are not depicted.

The multilayer body 2 may have a driving part group constituted by a plurality of driving parts 50 continuously aligning in the X direction, the driving parts 50 in the driving part group having the same area (hereinafter referred to as area A) where the inner electrode 32A and the inner electrode 34 overlap each other. When another driving part 50 is closer to the non-driving part 52 than is the driving part group in the X direction, the area where the inner electrode 32A of the other driving part 50 and the inner electrode 34 overlap each other is greater than the area A. When the driving part group is closer to the non-driving part 52 than is another driving part 50 in the X direction, the area where the inner electrode 32A of the other driving part 50 and the inner electrode 34 overlap each other is smaller than the area A Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modification as would fall within the scope and spirit of the inventions.

Certain aspects, advantages, and novel features of the embodiment have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

What is claimed is:

1. A multilayer piezoelectric device comprising:
a multilayer body formed from a plurality of piezoelectric layers stacked along a first direction, and having a base, a non-driving part and first and second driving parts, wherein the non-driving part and first and second driving parts extend in the same first direction from the base; and
first and second outer electrodes arranged on a surface of the multilayer body while being electrically insulated from each other;
wherein the first and second driving parts and non-driving part align along a second direction orthogonal to the first direction such that the first driving part is closer to the non-driving part than is the second driving part;
wherein each of the first and second driving parts has first and second inner electrodes opposing each other in the first direction through the piezoelectric layer interposed therebetween;
wherein the base has a third inner electrode extending along a plane orthogonal to the first direction;
wherein the first inner electrode is electrically connected to the first outer electrode but electrically insulated from the second outer electrode;
wherein the second and third inner electrodes are electrically connected to the second outer electrode but electrically insulated from the first outer electrode;
wherein the second inner electrodes of the first and second driving parts are each adjacent to the third inner electrode in the first direction and partly overlap the third inner electrode as seen in the first direction; and
wherein a first area where the third inner electrode and the second inner electrode of the first driving part overlap each other is greater than a second area where the third inner electrode and the second inner electrode of the second driving part overlap each other as seen in the first direction.

2. A multilayer piezoelectric device comprising:
a multilayer body formed from a plurality of piezoelectric layers stacked along a first direction, and having a base, first and second non-driving parts and first and second driving parts, wherein the first and second non-driving parts and first and second driving parts extend in the same first direction from the base; and
first and second outer electrodes arranged on a surface of the multilayer body while being electrically insulated from each other;
wherein the first and second driving parts align along the second direction so as to be between the first and second non-driving parts;
wherein, when a middle position is a point separated from the first and second non-driving parts by the same distance on a virtual line extending in a second direction orthogonal to the first direction, the first driving part is closer to the first non-driving part than is the second driving part, while the second driving part is closer to the middle position than is the first driving part;
wherein each of the first and second driving parts has first and second inner electrodes opposing each other in the first direction through the piezoelectric layer interposed therebetween;
wherein the base has a third inner electrode extending along a plane orthogonal to the first direction;
wherein the first inner electrode is electrically connected to the first outer electrode but electrically insulated from the second outer electrode;
wherein the second and third inner electrodes are electrically connected to the second outer electrode but electrically insulated from the first outer electrode;
wherein the second inner electrodes of the first and second driving parts are each adjacent to the third inner electrode in the first direction and partly overlap the third inner electrode as seen in the first direction; and
wherein a first area where the third inner electrode and the second inner electrode of the first driving part overlap each other is greater than a second area where the third inner electrode and the second inner electrode of the second driving part overlap each other as seen in the first direction.

3. A multilayer piezoelectric device comprising:
a multilayer body formed from a plurality of piezoelectric layers stacked along a first direction, and having a base, a non-driving part and first to third driving parts, wherein the non-driving part and first and third driving parts extend in the same first direction from the base; and
first and second outer electrodes arranged on a surface of the multilayer body while being electrically insulated from each other;
wherein the first to third driving parts and non-driving part align along a second direction orthogonal to the first direction such that the first to third driving parts sequentially increase distance to the non-driving part;
wherein each of the first to third driving parts has first and second inner electrodes opposing each other in the first direction through the piezoelectric layer interposed therebetween;
wherein the base has a third inner electrode extending along a plane orthogonal to the first direction;
wherein the first inner electrode is electrically connected to the first outer electrode but electrically insulated from the second outer electrode;
wherein the second and third inner electrodes are electrically connected to the second outer electrode but electrically insulated from the first outer electrode;
wherein the second inner electrodes of the first to third driving parts are each adjacent to the third inner electrode in the first direction and partly overlap the third inner electrode as seen in the first direction; and
wherein first to third areas where the third inner electrode overlaps the respective second inner electrodes of the first to third driving parts as seen in the first direction decrease sequentially.

4. The multilayer piezoelectric device according to claim 3, wherein, as seen in the first direction, in a third direction orthogonal to both of the first and second directions, the third inner electrode has a width increasing toward the non-driving part.

5. A multilayer piezoelectric device comprising:
a multilayer body formed from a plurality of piezoelectric layers stacked along a first direction, and having a base, first and second non-driving parts and first to third driving parts, wherein the first and second non-driving parts and first and third driving parts extend in the same first direction from the base; and
first and second outer electrodes arranged on a surface of the multilayer body while being electrically insulated from each other;
wherein, when a middle position is a point separated from the first and second non-driving parts by the same distance on a virtual line extending in a second direction orthogonal to the first direction, the first to third driving parts align along the second direction sequentially from the first non-driving part toward the middle position;
wherein each of the first to third driving parts has first and second inner electrodes opposing each other in the first direction through the piezoelectric layer interposed therebetween;
wherein the base has a third inner electrode extending along a plane orthogonal to the first direction;
wherein the first inner electrode is electrically connected to the first outer electrode but electrically insulated from the second outer electrode;
wherein the second and third inner electrodes are electrically connected to the second outer electrode but electrically insulated from the first outer electrode;
wherein the second inner electrodes of the first to third driving parts are each adjacent to the third inner electrode in the first direction and partly overlap the third inner electrode as seen in the first direction; and
wherein first to third areas where the third inner electrode overlaps the respective second inner electrodes of the first to third driving parts as seen in the first direction decrease sequentially.

6. The multilayer piezoelectric device according to claim 5, wherein, as seen in the first direction, in a third direction orthogonal to both of the first and second directions, the third inner electrode has a width increasing from the middle position toward the first non-driving part side.

* * * * *